United States Patent [19]

Miyauchi et al.

[11] Patent Number: 4,725,878
[45] Date of Patent: Feb. 16, 1988

[54] SEMICONDUCTOR DEVICE

[75] Inventors: Akira Miyauchi, Kawasaki; Hiroshi Nishimoto, Tokyo; Tadashi Okiyama; Hiroo Kitasagami, both of Kawasaki; Masahiro Sugimoto, Yokosuka; Haruo Tamada, Yokohama; Shinji Emori, Urawa, all of Japan

[73] Assignee: Fujitsu Limited, Kawasaki, Japan

[21] Appl. No.: 844,943

[22] Filed: Mar. 27, 1986

[30] Foreign Application Priority Data

Mar. 30, 1985 [JP] Japan ................... 60-64992
Apr. 10, 1985 [JP] Japan ................... 60-74438

[51] Int. Cl.$^4$ ............................................. H01L 39/02
[52] U.S. Cl. .................................. 357/80; 357/71; 357/72; 357/74
[58] Field of Search ................ 357/68, 71, 75, 74, 357/80

[56] References Cited

U.S. PATENT DOCUMENTS

| 3,628,105 | 12/1971 | Sakai et al. | 357/80 |
| 3,777,221 | 12/1973 | Tatusko et al. | 357/80 |
| 4,667,219 | 5/1987 | Lee et al. | 357/80 |
| 4,667,220 | 5/1987 | Lee et al. | 357/80 |

Primary Examiner—Martin H. Edlow
Assistant Examiner—Gregory A. Key
Attorney, Agent, or Firm—Staas & Halsey

[57] ABSTRACT

A semiconductor device provided with signal lines which connect a chip, provided at a top portion of a package, with external terminals provided at a bottom portion of the package. The signal lines have portions formed along side surfaces of the package. Ground surfaces are formed at predetermined distances on two sides of the high-speed signal lines. A coplanar waveguide is formed by the high-speed signal lines and the ground surfaces, so the impedance of vertical portions of the high-speed signal lines is matched to the circuits connected thereto.

5 Claims, 11 Drawing Figures

SEMICONDUCTOR DEVICE

BACKGROUND OF THE INVENTION

1. Field of the Invention

The present invention relates to a semiconductor device provided with a package, more particularly to a semiconductor device provided with a multilayer high-speed IC package in which an IC chip is carried on a multilayer insulative substrate.

2. Description of the Related Art

Many conventional semiconductor devices are provided with so-called high-speed IC packages in which IC chips for inputting and outputting various signals, including high-speed signals, are mounted on a multilayer insulative substrate.

In this kind of multilayer high-speed IC package, the major portions of the signal lines which connect the IC chip at the upper part of the IC package with the external terminals at the bottom part of the IC package extend vertically with respect to the IC package.

The length of the vertical portions of the signal lines increase when there are multiple layers of insulative substrates of the IC package and along with the increased thickness of the insulative substrate.

Usually, for the purpose of decreasing the load at the driving side for driving the IC chip, it is necessary to increase the characteristic impedance of the signal lines connected to the IC chip. Accordingly, it is necessary to increase the thickness of the insulative substrate, that is, the thickness of the insulative layers positioned at the two sides of the interlayer portions of the signal lines. That is, for the purpose of making the interlayer portions of the signal lines match the characteristic impedance of the signal lines, it is necessary that, when, for example, the interlayer portions are constructed as balanced strip lines (lines in which a ground surface is provided via insulative layers of a predetermined thickness and a predetermined dielectric constant for both sides of the interlayer portions), the thickness of the insulative layers at the two sides is tripled (for example, the thickness of the insulative plates at the two sides of the interlayer portions is made 1 mm to increase the characteristic impedance of the interlayer portions, for example, from 50 Ω to 75 Ω. In such a case, the transmission length of the vertical portions increases considerably. No particular techniques have conventionally been applied regarding the impedance characteristics of the vertical transmission lines.

With some of the signal lines connected to the IC chip, particularly, for example, high-speed signal lines, which may have bit rates of as high as one gigabit per second, the increase of the vertical transmission length can cause a significant impedance mismatch.

Further, in the conventional semiconductor device as mentioned above, crosstalk occurs between adjacent signals input and output through the adjacently arranged signal terminals. This becomes especially serious when the frequency of the signals becomes high, causing undesirable disturbances in the signal waveforms, and oscillation (especially in amplifier circuits).

SUMMARY OF THE INVENTION

An object of the present invention is to provide a semiconductor device in which the transmission characteristics of high-speed signals can be improved.

Another object of the present invention is to provide a semiconductor device in which crosstalk between adjacent signals can be eliminated.

According to the present invention, there is provided a semiconductor device including: signal lines for connecting a chip provided at the upper part of a package, with external terminals provided at the bottom part of the package, the signal lines running along the side surfaces of the package; and ground surfaces provided at predetermined distances on two sides of high-speed signal lines provided on the side surfaces, a coplaner waveguide being formed by the high-speed signal lines on the side surfaces and the ground surfaces, so as to match the impedance of vertical portions of said high-speed signal lines.

Further features and advantages of the present invention will be apparent from the ensuing description with reference to the accompanying drawings to which, however, the scope of the invention is in no way limited.

DESCRIPTION OF THE PREFERRED EMBODIMENTS

Figure 1:
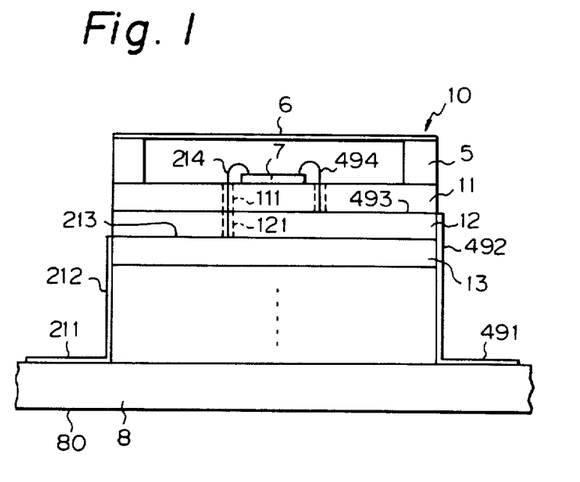
FIG. 1 is a cross-sectional view of a semiconductor device of this kind.
Figure 2:
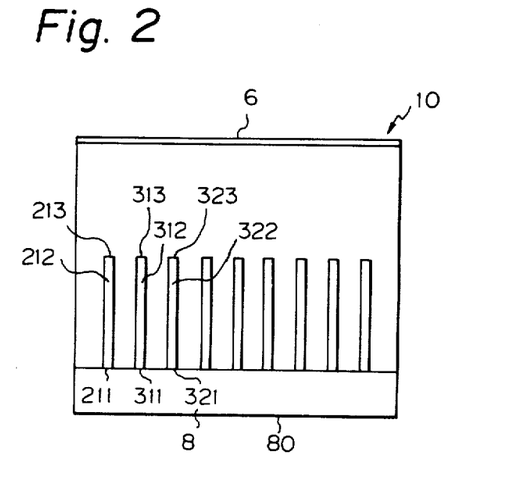
FIG. 2 is left side view of the semiconductor device shown in FIG. 1.

A semiconductor device with a high-speed IC package is shown in FIGS. 1 and 2. This device is not a prior art but the so called in-house prior art which is an intermediate art from a prior art to the present invention.

In FIGS. 1 and 2, item 10 is an IC package, items 11, 12, 13 ... are insulative substrates (for example, ceramic plates) superposed on each other, and item 7 is an IC chip.

The IC chip 7 is connected to high-speed signal lines (for example, high-speed signal lines which carry a signal having a bit rate on the order of one gigabit per second, low-speed signal lines (for example, control signal lines which carry a signal of one kHz to one MHz), ground lines, and power supply lines. These lines are formed on or in the IC package and are connected to corresponding external terminals provided at the lower part of the IC package.

In FIG. 1, for example, a high-speed signal line for connecting an external terminal 211 and an IC chip 7 comprises a side surface line 212 on a side surface of the IC package 10, an interlayer portion 213 provided between insulative substrates (for example, between insulative plates 12 and 13), and a portion 214 of wire through via holes 111, 121 in the insulative plates (for example, insulative plates 11 and 12). Further, a ground line for connecting an external terminal 491 and the IC chip 7 comprises a side surface line 492, an interlayer portion 493 (for example between the insulative plates 11 and 12), and a portion 494 of wire through a via hole in an insulative substrate (for example, an insulative substrate 11). Further, a low-speed signal line and a power supply line for connection with the IC chip are similarly formed (not shown).

As mentioned above, the insulative substrate 11, 12, 13 . . . are formed in a multilayer manner and, the areas between the insulative substrates are used for deploying the interlayer portions mentioned above, with the interlayer portions being insulated from each other. Frame body 5 and cap 6 enclose the IC chip 7. IC package 10 is placed on a printed circuit board 8 which has a ground surface 80 provided on its reverse side.

FIG. 2 shows an example of the state of connection of one side surface of the conventional semiconductor device shown in FIG. 1. In FIG. 2, the side surface line 212 of the high-speed signal line and the side surface lines 312 and 322 of the low-speed signal lines are arranged at predetermined intervals. Further, in FIG. 2, 311 and 321 are the external terminals of the low-speed signal lines 312 and 322, respectively. Items 313 and 323 are the interlayer portions of the low-speed signal lines 312 and 322, respectively. FIG. 2 thus shows an example where the interlayer portion 213 of the highspeed signal line and the interlayer portions 313 and 323 of the low-speed signal lines are between the same insulation substrates.

FIGS. 3 to 7 show the construction of a semiconductor device with a high-speed IC package 1 according to one embodiment of the present invention. In FIGS. 3 to 7, portions corresponding to portions shown in FIGS. 1 and 2 bear the same reference numerals.

Figure 3:
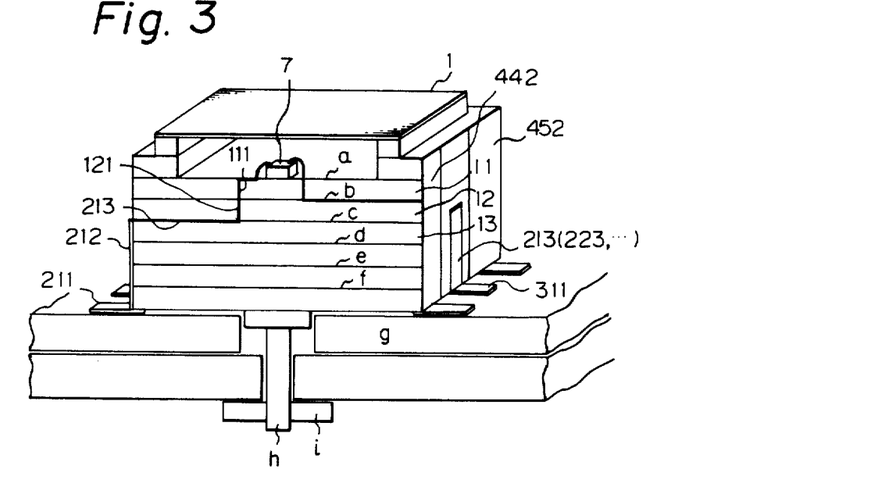
FIG. 3 is a drawing of one embodiment of the semiconductor device according to the present invention.

In FIG. 3, "a" is a surface on which elements such as the IC chip 7 are mounted, "b", "d", and "f" are ground layers, "c" is a high-speed signal layer, "e" is a low-speed signal layer, "g" a printed circuit board, "h" a stud, and "i" is a screw. The characteristic feature of the present invention is to provide ground surfaces 412 and 522 on the two sides of the side surface lines 212 . . . so as to form a coplaner waveguide.

Also, in FIGS. 3 to 7, 11, 12, 13 . . . are insulative substrates superposed on each other, with one or more IC chips 7 being mounted thereon.

High-speed signal lines, low-speed signal lines, a ground line, and a power supply line are connected to the IC chip. These lines are connected to the corresponding external terminals provided at the bottom of the package. In the embodiment shown in the drawings, low-speed signal lines are provided on one side surface of the package (refer especially to FIG. 6), and high speed signal lines are provided on the other side surface (refer especially to FIG. 7). Of course, it is understood that the signal lines, the ground line, and the power supply line may be provided on four side surfaces of the package in accordance with a predetermined order.

The high-speed signal lines for connecting the external terminals 211, 221 . . . and the IC chip 7 are formed by side surface lines 212, 222, . . . provided on the side surface of the package 1; interlayer portions 213, 223, . . . provided between the insulative substrates (such as between the insulative plates 12 and 13); and the portions 214, . . . running through via holes 111, 121, . . . of the insulative substrate (for example, the insulative plates 11 and 12). Further, the ground lines for connecting external terminals 411, 421, 431, 441, 451, . . . and the IC chip 7 are formed by side surface portions 412, 422, 432, 442, 452, . . . ; interlayer portions 443, . . . (for example, between the insulative substrates 11 and 12 in FIG. 5) connected to one of the side surface portions (for example, 442); and portions 444, . . . provided through via holes of the insulative substrate. In the present invention, it is essential to provide side surface portions of ground lines (in the embodiment mentioned above, the side surface lines 412, 422, and 432) at predetermined distances on both sides of the side surface lines 212, 222, . . . of the high-speed signal lines.

Further, in the above embodiment, the side surface lines 412, 422, 432, 442, 452, . . . of the ground lines provided on the side surfaces on the four sides of the package 1 are connected to the cap 6 at the top of the package. The potential of the cap 6 is made the same as the ground potential so as to shield the internal circuits from the external electromagnetic field and thus ensure stable operation of the circuit.

Figure 4:
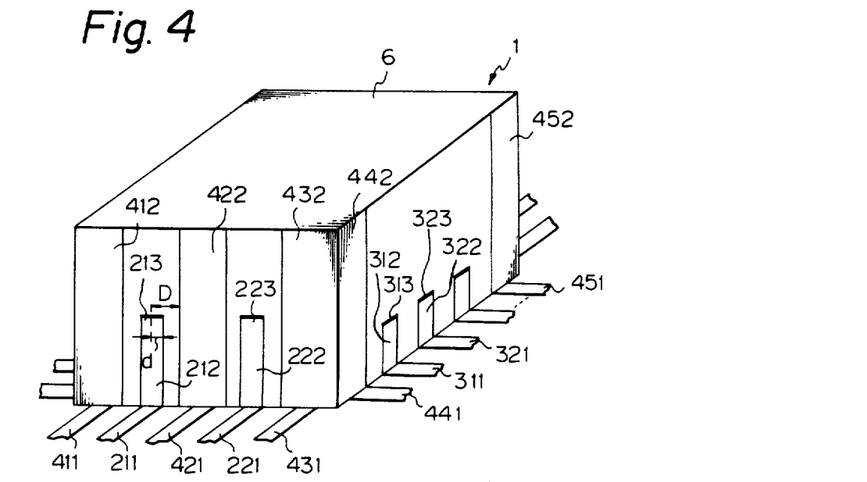
FIG. 4 is a perspective view of another embodiment of the semiconductor device according to the present invention.
Figure 5:
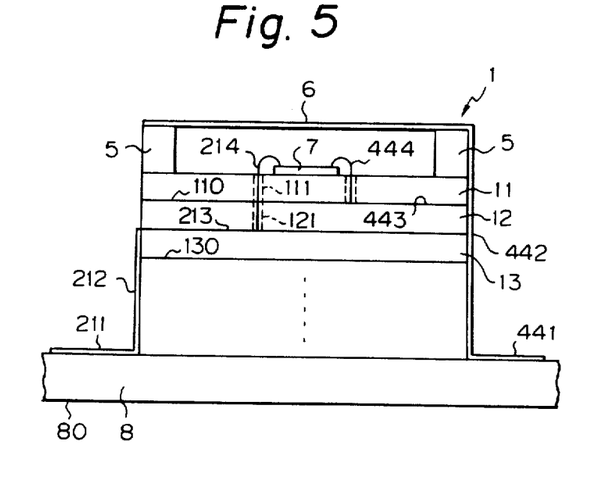
FIG. 5 is a cross-sectional view of the semiconductor device shown in FIG. 4.
Figure 6:
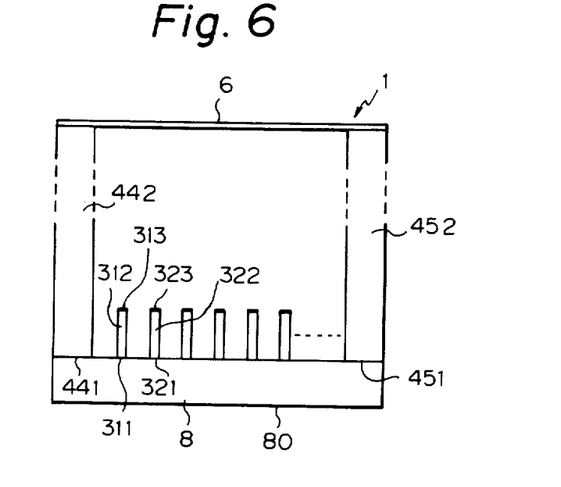
FIG. 6 is a right side view of the semiconductor device shown in FIG. 5.
Figure 7:
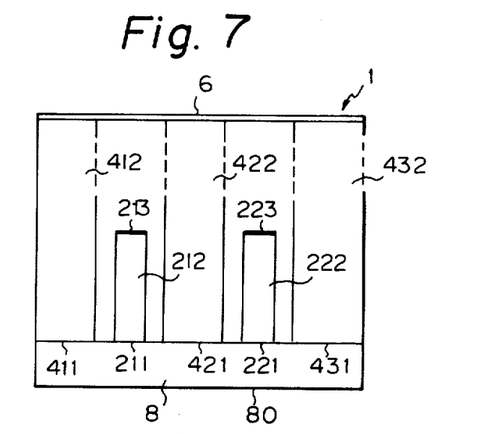
FIG. 7 is a left side view of the semiconductor device shown in FIG. 5.

Low-speed signal lines for connecting external terminals 311, 321, . . . and the IC chip are also formed by side surface lines 312, 322 and interlayer portions 313, 323, shown in FIG. 6 and in the right side of FIG. 4. The power supply line is similarly formed. Further, frame bodies, a printed circuit board 8 on which the IC package 1 is mounted, and a ground layer 80 which is provided on the reverse side of the printed circuit board 8 are shown in FIG. 5.

In the construction mentioned above, the most important points are that the high-speed signal lines for connecting the IC chip provided at the top of the IC package and the external terminals provided at the bottom of the IC package are connected along the side surface of the package (corresponding to the side surface lines 212, 222 in the above-mentioned embodiment); that ground layers are provided at predetermined distances on the two sides of the side surface portions 212, 222 (the side surface portions 412, 422, and 432 in the above-mentioned embodiment), and that the high-speed signal lines 212, 222 provided on the side surface and ground lines 412, 422, 432 provided on the two sides of the high-speed signal lines form coplaner waveguides, whereby impedance matching of vertical portions 212, 222 of the high-speed signal lines is effected.

If the characteristic impedance of the high-speed signal lines is 50 ohms, the side surface lines 212, 223 are matched to this characteristic impedance, and if the dielectric constant (that is, the dielectric constant of the insulative layer between the high-speed signal lines and the ground surfaces provided at the two sides of the high-speed signal lines) of the insulative substrate (usually formed by a ceramic plate) is 10, the ratio (d/D) between the size D shown in FIG. 4 (the distance between a center of a high-speed signal line and the ground surfaces) and the size d (the distance between a center of the high-speed signal line and the edge portion thereof) is set to about 0.53 (as one example, D is 755 $\mu$m and d is 400 $\mu$m). Further, when the characteristic impedance is decreased further, the ratio d/D is increased in accordance with it.

In this case, by providing most of the vertical portions of the high-speed signal lines along the side surface of the package (that is, positioning the interlayer portions as high as possible), it is possible to obtain almost a perfect match of the impedance of the vertical portions without giving special consideration to the impedance characteristics of the remainder of the vertical portions (that is, the main portion passing through the via hole of the insulative substrate.

Further, in the embodiment shown in the drawings, ground lines are provided not only at the two sides of the side surface lines of the high-speed signal lines (as the side surface portions 412, 422, 432), but also, for example, as the side surface lines 442, 452, in FIG. 6. It is preferable to connect the ground lines provided on the sides of the package to the cap 6.

Further, in the embodiment mentioned above, ground surfaces 110 and 130 are formed, between insulative layers having a predetermined thickness (insulative plates 12, 13 having a predetermined thickness in the embodiment shown in FIG. 5), at the upper side and lower side of the interlayer portions 213 of the high-speed signal lines. The interlayer portion 213 and the ground surfaces 110 and 130 form a balanced strip line, enabling impedance matching of the interlayer portions 213 also. Further, in FIG. 5, the ground surface 110 is between the insulative plates 11 and 12 (except for the portion of the via hole passing through the portions 214, etc.). On the other hand, the ground surface 130 is provided between the insulative plate 13 and the insulative plate provided thereunder.

Further, each printed circuit provided on the printed circuit board 8 connected to each external terminal under the IC package forms, together with the ground surface on the reverse of the printed circuit board, a micro-strip line as the transmission line.

As described in detail above, impedance matching of the vertical portions of the high-speed signal lines in a multilayer high-speed IC package can be easily obtained, so the transmission characteristic of high-speed signals can be improved and deterioration of the signal wave and S/N ratio can be prevented.

Figure 8:
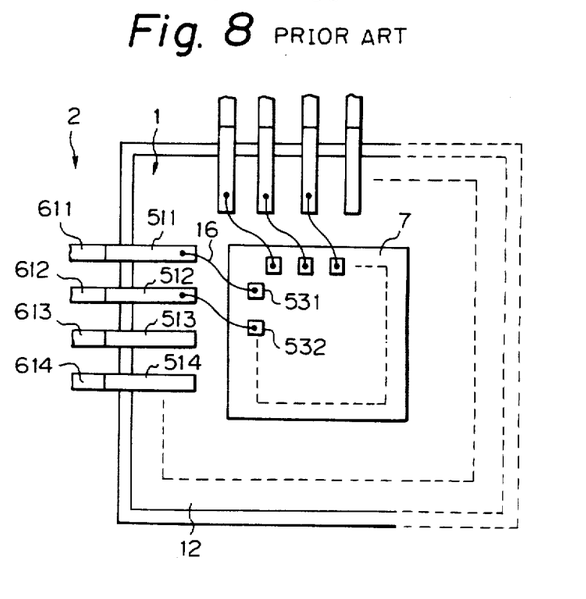
FIG. 8 is a diagram of a conventional semiconductor device.

FIG. 8 is a drawing of a conventional semiconductor device. An insulative substrate 12 in the IC package 1 mounted on a printed circuit board 2 has one or more IC chips 7 mounted at the center thereof. At the peripheral portion, various terminals, that is, signal terminals (input terminals and output terminals), ground terminals, and power supply terminals are provided from inside the package 1 (above the insulative substrate 12) to the external portion thereof (above printed circuit board 2) by, for example, plating of thin film conductive materials. In FIG. 8, these terminals are shown by symbols 511, 512, 513, 514, . . . These terminals on the printed circuit board 2 are connected to printed circuits for corresponding signal transmission lines (usually, the printed circuit forms a micro-strip line as the transmission line together with the ground metal surface provided on the reverse surface of the printed circuit) 611, 612, 613, 614, . . . Further, 531, 532, . . . are pads provided on an IC chip 7, and 16 is a wire for connecting the pads 531, 532, . . . and terminals corresponding to these pads.

In this conventional semiconductor device, the impedance of the terminal portions of the IC package does not sufficiently match with signal lines connected to the terminals. Therefore, when the frequency of the transmitted signal increases so that the level thereof rapidly changes (so-called high-speed signal), there is a problem of a significant impedance mismatching at the signal terminals.

Conceivably, the signal terminal portions may be formed as a micro-strip line to obtain an impedance match. Formation of the micro-strip line necessitates provision of a ground surface on the insulative substrate opposing the signal terminals. Thus, the insulative substrate must be formed using two-layer construction, making the construction complicated.

Further, in the above-mentioned conventional semiconductor device, crosstalk occurs between adjacent signals input and output via adjacently arranged signal terminals. This becomes especially serious when the frequency of the signals become high, causing undisirable disturbance in the signal waveforms and oscillation (especially in amplifier circuits).

Figure 9:
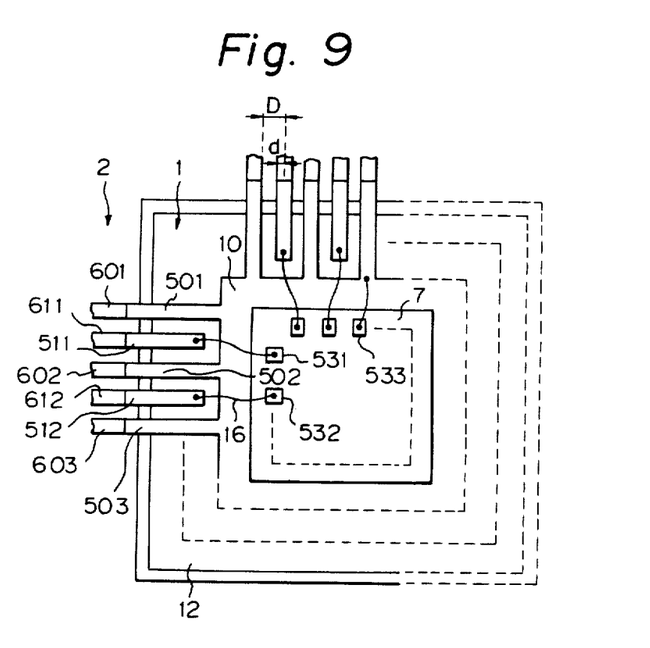
FIG. 9 is a diagram of another embodiment of the semiconductor device according to the present invention.
Figure 10:
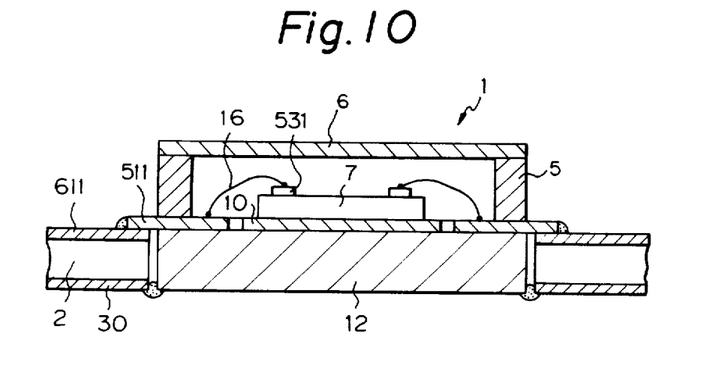
FIG. 10 is a cross-sectional view of the semiconductor device shown in FIG. 9.

FIGS. 9 and 10 show another embodiment of the semiconductor device according to the present invention. The insulative substrate 12 on the IC package 1 mounted on the printed circuit board 2 has one or more IC chips 7 provided at the center portion thereof. At peripheral portions, many signal terminals (input terminals and output terminals) 511, 512, . . . are provided from the internal portion of the package 1 (above insulative substrate 12) to the external portion (on the printed circuit board 2). On the printed circuit board 2, these terminals are connected to the corresponding printed circuits 611, 612, . . . for the signal transmission. Here, the printed circuits 611, 612, . . . usually form a micro-strip line as the transmission line together with the ground metal surface 30 provided on the reverse of the printed circuit board. Further, 531, 532, . . . are pads provided on the IC chip 7, and 16 are wires for connecting the pads 531, 532, . . . and the terminal corresponding to these pads.

Ground terminals 501, 502, 503, . . . are provided at predetermined distances on the two sides of the signal terminals 511, 512, . . . The signal terminals 511, 512, . . . and the ground terminals 501, 502, 503, . . . (for example, signal terminals 511 and ground terminals 501, 502) form a coplaner waveguide. This enables impedance matching for the signal lines connected to the signal terminals 511, 512 . . . (that is, the transmission line formed as a microstrip line on the printed circuit board). In the embodiment shown in FIG. 9, a metal plate 10 is formed so as to connect the ground terminals mentioned above, and the IC chip 7 is mounted on the metal plate 10 (refer to FIG. 10).

In the present invention, the signal terminals provided on the IC package form a coplaner waveguide together with the ground terminals provided at the two ends of the signal terminals, enabling an impedance match for the signal lines connected to the signal terminals (usually formed as microstrip line). The impedance of the coplaner waveguide is determined by the width of the signal terminals, the distance between the signal terminals and the ground terminals, and the dielectric constant of material between the signal terminals and the ground terminals.

Further, the ground terminals 501, 502, 503, . . . are formed along the two sides of the signal terminals from the internal portion (above the insulative substrate 12) of the package to the external portion thereof (on the printed circuit board) and are connected to printed circuits 601, 602, 603, . . . on the printed circuit board 2.

The printed circuits 601, 602, 603, ... are connected to the ground side by connection, for example, via through holes provided in the printed circuit board 2, to the ground metal surface 30 on the reverse surface of the printed circuit board 2. Further, those of the IC pads (for example, 533 in FIG. 9) to be connected to the ground terminals are connected to any one of the many ground terminals.

According to the present invention, impedance matching of the signal terminal portion provided on the IC package can be obtained with simple construction. Further, crosstalk between the signals transmitted via adjacent signal terminals can be completely prevented by providing ground terminals between adjacent signal terminals. Further, in the IC package shown in the drawings, lines for connecting the signal terminals and IC package exist, however, the impedance characteristic can usually be ignored. If necessary, instead of the line connection, the signal terminals may be directly connected to the IC chip.

Figure 11:
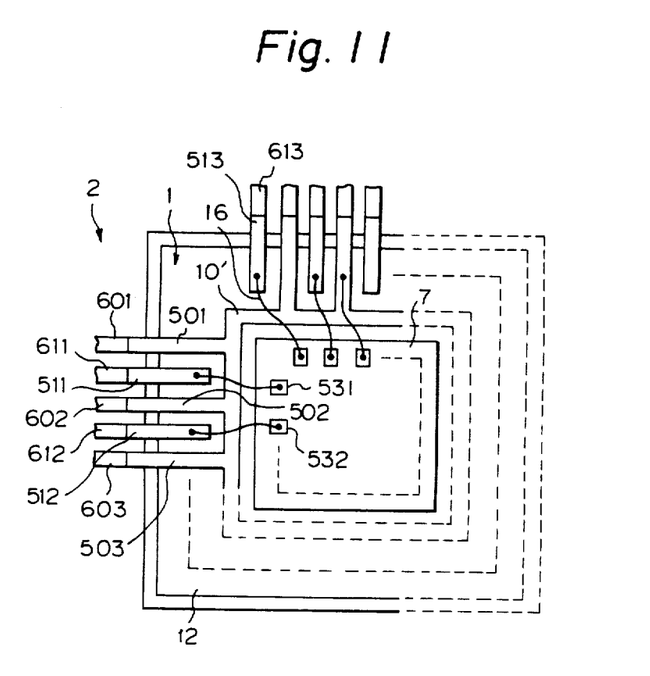
FIG. 11 is a diagram of another embodiment of the semiconductor device according to the present invention.

FIG. 11 shows a modified embodiment of the semiconductor device shown in FIG. 9. The portion for connecting the ground terminals 501, 502, 503, ... is formed as a metal frame 10' instead of the metal plate 10 shown in FIG. 9. Further, in FIG. 11, the signal terminal 513 is provided with a ground terminal only on the right side, therefore, no coplaner waveguide is formed. Therefore, in this signal terminal, a signal which does not require consideration of the impedance matching of the signal terminal portion, for example, a signal which has a low frequency, should be input and output.

According to the above embodiments of the present invention, impedance matching of the signal terminal portion in the IC package can be easily achieved. Therefore, the transmission characteristics of high-speed signals can be improved, deterioration of the signal waves and S/N ratio can be prevented, and crosstalk between adjacent signals can be completely prevented.

What is claimed is:

1. A semiconductor device having an upper and lower portion and side surfaces, comprising:
    a chip provided at the upper portion of said device;
    a plurality of external terminals provided at the lower portion of said device;
    a plurality of a first set of signal lines for coupling said external terminals to said chip, each of said signal lines being provided along the side surfaces of said device; and
    a plurality of grounding surfaces provided at a predetermined distance from each side of said first set of signal lines provided on the side surfaces, a coplanar waveguide being formed by set of signal lines on the side surfaces and said ground surfaces matching the impedance of said first type of signal lines.

2. A semiconductor device according to claim 1, further comprising:
    grounding surfaces provided at a predetermined distance on either side of said external terminals to prevent crosstalk between said external terminals.

3. A semiconductor device according to claim 1, wherein each of said grounding surfaces are formed as metal planes extending from an internal portion of said semiconductor device to the vicinity of said external terminals.

4. A semiconductor device according to claim 2, wherein said grounding surfaces are formed as metal frames which surround the chip on said IC package and extend from an internal portion of said semiconductor device to the vicinity of said external terminals.

5. A semiconductor device according to claim 1, further comprising a plurality of a second set of signal lines coupling said external signals to said chip, each of said second set of signal lines being provided along the side surfaces of said device.

* * * * *

UNITED STATES PATENT AND TRADEMARK OFFICE
CERTIFICATE OF CORRECTION

PATENT NO. : 4,725,878

DATED : February 16, 1988

INVENTOR(S) : Miyauchi et al.

It is certified that error appears in the above-identified patent and that said Letters Patent is hereby corrected as shown below:

Col. 1, line 45, "mm" should be --mm)--.

Col. 3, line 50, "522" should be --422--;

line 52, after "7," insert --items--.

Signed and Sealed this

Ninth Day of August, 1988

Attest:

DONALD J. QUIGG

Attesting Officer        Commissioner of Patents and Trademarks